(12) United States Patent
Karlsson et al.

(10) Patent No.: US 6,867,130 B1
(45) Date of Patent: Mar. 15, 2005

(54) ENHANCED SILICIDATION OF POLYSILICON GATE ELECTRODES

(75) Inventors: Olov B. Karlsson, San Jose, CA (US); Simon S. Chan, Saratoga, CA (US); William G. En, Milpitas, CA (US); Mark W. Michael, Cedar Park, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/445,936

(22) Filed: May 28, 2003

(51) Int. Cl.[7] .................. H01L 21/4763; H01L 21/44
(52) U.S. Cl. .................. 438/655; 438/649; 438/651; 438/656; 438/659; 438/664; 438/682; 257/414; 257/768; 257/769; 257/770
(58) Field of Search .................. 438/649, 651, 438/652, 655–657, 659, 664, 682, 233, 299, 630; 257/768–770, 414, 767

(56) References Cited

U.S. PATENT DOCUMENTS 5,953,612 A * 9/1999 Lin et al. .................. 438/299
6,187,675 B1 * 2/2001 Buynoski .................. 438/655
6,620,664 B2 * 9/2003 Ma et al. .................. 438/183
6,657,244 B1 * 12/2003 Dokumaci et al. .......... 257/288

* cited by examiner

Primary Examiner—Donghee Kang

(57) ABSTRACT

Semiconductor devices exhibiting reduced gate resistance and reduced silicide spiking in source/drain regions are fabricated by forming thin metal silicide layers on the gate electrode and source/drain regions and then selectively resilicidizing the gate electrodes. Embodiments include forming the thin metal silicide layers on the polysilicon gate electrodes and source/drain regions, depositing a dielectric gap filling layer, as by high density plasma deposition, etching back to selectively expose the silicidized polysilicon gate electrodes and resilicidizing the polysilicon gate electrodes to increase the thickness of the metal silicide layers thereon. Embodiments further include resilicidizing the polysilicon gate electrodes including a portion of the upper side surfaces forming mushroom shaped metal silicide layers.

6 Claims, 5 Drawing Sheets

US 6,867,130 B1

ENHANCED SILICIDATION OF POLYSILICON GATE ELECTRODES

TECHNICAL FIELD

The present invention relates to the fabrication of micro-miniaturized, high speed semiconductor devices, particularly to self-aligned silicide (salicide) technology, and the resulting semiconductor devices. The present invention is particularly applicable to ultra large scale integrated circuit (ULSI) systems having features in the deep sub-micron regime.

BACKGROUND ART

As integrated circuit geometries continue to plunge into the deep sub-micron regime, it becomes increasingly more difficult to accurately form discreet devices on a semiconductor substrate exhibiting the requisite reliability. High performance microprocessor applications require rapid speed of semiconductor circuitry. The speed of semiconductor circuitry varies inversely with the resistance (R) and capacitance (C) of the interconnection system. The higher the value of the R×C product, the more limiting the circuit operating speed. Miniaturization requires long interconnects having small contacts and small cross-sections. Accordingly, continuing reduction in design rules into the deep sub-micron regime requires decreasing the R and C associated with interconnection paths. Thus, low resistivity interconnection paths are critical to fabricating dense, high performance devices.

A common approach to reduce the resistivity of the interconnect to less than that exhibited by polysilicon alone, e.g., less than about 15–300 ohm/sq, comprises forming a multilayer structure consisting of a low resistance material, e.g., a refractory metal silicide, on a doped polycrystalline silicon layer, typically referred to as a polycide. Advantageously, the polycide gate/interconnect structure preserves the known work function of polycrystalline silicon and the highly reliable polycrystalline silicon/silicon oxide interface, since polycrystalline silicon is directly on the gate oxide.

Various metal silicides have been employed in salicide technology, such as titanium, tungsten, and cobalt. Nickel, however, offers particular advantages vis-à-vis other metals in salicide technology. Nickel requires a lower thermal budget in that nickel silicide and can be formed in a single heating step at a relatively low temperature of about 250° C. to about 600° C. with an attendant reduction in consumption of silicon in the substrate, thereby enabling the formation of ultra-shallow source/drain junctions.

In conventional salicide technology, a layer of the metal is deposited on the gate electrode and on the exposed surfaces of the source/drain regions, followed by heating to react the metal with underlying silicon to form the metal silicide. Unreacted metal is then removed from the dielectric sidewall spacers leaving metal silicide contacts on the upper surface of the gate electrode and on the source/drain regions. In implementing salicide technology, it was also found advantageous to employ silicon nitride sidewall spacers, since silicon nitride is highly conformal and enhances device performance, particularly for p-type transistors.

In implementing salicide technology on micro-miniaturized devices, it is desirable to form relatively thick metal silicide regions on the gate electrodes for reduced resistance and, hence, increased operating speed. However, as the thickness of the metal silicide layers on the source/drain regions increases and/or junction depths decrease, penetration or spiking of the metal silicide through the shallow junction occurs, in addition to silicide separation.

Accordingly, there exists a need for salicide methodology enabling the fabrication of micro-miniaturized semiconductor devices having a desirably thick metal silicide layer on the gate electrodes while minimizing the thickness of the metal silicide layers on the source/drain regions to avoid silicide spiking and separation.

DISCLOSURE OF THE INVENTION

An advantage of the present invention is a method of manufacturing a semiconductor device having relatively thick metal silicide contacts on gate electrodes and relatively thin metal silicide contacts on source/drain regions.

Another advantage of the present invention is a semiconductor device having relatively thick metal silicide contacts on gate electrodes and relatively thin metal silicide contacts on associated source/drain regions.

Additional advantages and other features of the present invention will be set forth in part in the description which follows, and in part will become apparent to those having ordinary skill in the art upon examination of the following or may be learned by practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a plurality of polysilicon gate electrodes, each having an upper surface and side surfaces, over an upper surface of a silicon substrate with a gate dielectric layer therebetween; forming source/drain regions on the upper surface of the substrate on opposite sides of each gate electrode with a channel region therebetween; forming a metal silicide layer, having a first thickness, on the upper surface of the gate electrodes and on the source/drain regions; depositing a first dielectric layer over the substrate filling the gaps between the gate electrodes and extending above the metal silicide layers on the gate electrodes; etching back the first dielectric layer to selectively expose the metal silicide layers on the upper surfaces of the gate electrodes but not the metal silicide layers on the source/drain regions; and increasing the first thickness of the metal silicide layers on the gate electrodes to form second metal silicide layers on the gate electrode having a second thickness greater than the first thickness.

Embodiments of the present invention comprise depositing an oxide layer by high density plasma oxide deposition as the first dielectric layer and etching back the first dielectric layer to expose upper portions of the side surfaces of the gate electrodes under the first metal silicide layers followed by resilicidation of the gate electrodes, thereby forming metal silicide on the side surfaces of the gate electrodes such that the second metal silicide layers are mushroom shaped comprising an upper portion and lower portions formed on side surfaces of the gate electrode. Embodiments further include depositing a second dielectric layer on the first dielectric layer with a grain boundary interface therebetween and then planarizing the upper surface of the second dielectric layer, as by chemical mechanical polishing (CMP).

Another aspect of the present invention is a semiconductor device comprising: a plurality of polysilicon gate electrodes, each having an upper surface and side surfaces, over an upper surface of a silicon substrate with a gate dielectric layer therebetween, the gate electrodes being spaced apart by a gap therebetween; source/drain regions in the upper surface of the substrate on opposite sides of each gate electrode with a channel region therebetween; a first metal silicide layer, having a first thickness, on the source/drain regions; a second metal silicide layer having a second thickness greater than the first thickness, on the upper surface of the gate electrodes; a first dielectric layer filling the gaps between the gate electrodes, covering the first metal silicide layers and extending above the substrate surface to a height under the second metal silicide layers; and a planarized second dielectric layer on the first dielectric layer with an interface therebetween and covering the second metal silicide layers.

Additional advantages of the present invention will become readily apparent to those having ordinary skill in the art from the following detailed description, wherein embodiments of the present invention are described simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
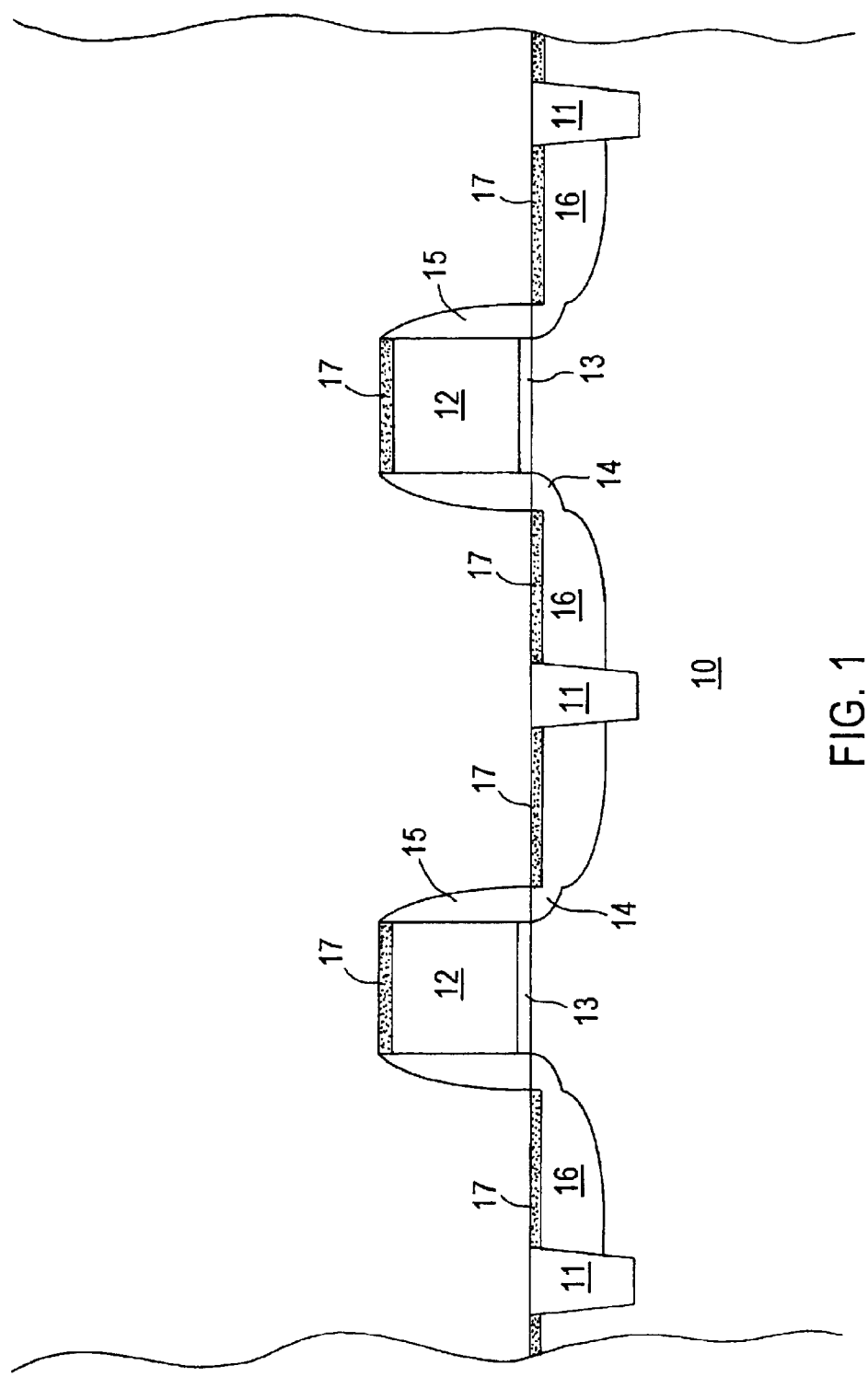
FIGS. 1 through 5 schematically illustrate sequential phases of a method in accordance with an embodiment of the present invention, wherein like features are denoted by like reference characters.

The present invention addresses and solves problems attendant upon implementing conventional salicide technology in fabricating micro-miniaturized semiconductor devices. As device geometries shrink into the deep submicron regime, the operating speed becomes an issue. Accordingly, it is desirable to form a relatively thick metal silicide layer on the gate electrodes. However, as the thickness of the metal silicide layers formed on the source/drain region increases and/or the junction depth decreases, metal silicide spiking occurs through the junction as well as metal silicide separation. The present invention addresses and solves that problem generated by conflicting processing objectives by providing efficient methodology enabling the fabrication of semiconductor devices having a relatively thick metal silicide layer on the gate electrodes while having a relatively thin metal silicide layer on the source/drain regions.

In accordance with embodiments of the present invention, an initial silicidation is implemented to form relatively thin metal silicide layers, such as nickel silicide, on the upper surface of the gate electrodes and on source/drain regions, as at a thickness of about 50 Å to about 100 Å. A first dielectric layer is deposited, such as a silicon oxide layer by high density plasma oxide deposition, which high density plasma oxide (HDP) fills gaps between gate electrodes, covers the metal silicide layers on the source/drain regions and extends above the middle silicide layers on the gate electrodes. The HDP oxide layer is then selectively etched back, as by employing a dilute solution of hydrofluoric acid, e.g., a buffered oxide etch, to expose the metal silicide layers on the gate electrodes but not the metal silicide layers on the source/drain regions. Typically, the HDP oxide is etched back sufficiently to expose an upper portion of the side surfaces of the gate electrodes under the metal silicide layers thereon. Resilicidation is then implemented, as by depositing a layer of metal, e.g., nickel, and then heating. During heating, silicon in the gate electrode diffuses through the initially formed metal silicide layer on the upper surface and reacts with the deposited metal thereby increasing the thickness of the metal silicide layer. In addition, silicon exposed on the side surfaces now also reacts with the deposited metal, thereby forming metal silicide layers on the side surfaces of the gate electrode. The resulting metal silicide on the gate electrodes exhibits a mushroom shape, the upper surface of which typically an increased thickness of 100 Å to 200 Å, with metal silicide portions on the side surfaces of the gate electrode having a thickness of about 50 Å to 100 Å.

A method in accordance with an embodiment of the present invention is schematically illustrated in FIGS. 1 through 5. Adverting to FIG. 1, a plurality of polysilicon gate electrodes 12 are formed over silicon substrate 10 with a gate dielectric layer 13 therebetween. Dielectric sidewall spacers 15, such as silicon nitride, are formed on side surfaces of the gate electrodes 12. Shallow source/drain extensions 14 are typically formed prior to forming sidewall spacers 15 and source/drain regions 16 are typically formed subsequent to forming sidewall spacers 15. Reference numeral 11 denotes shallow trench isolation regions between adjacent active regions. First relatively thin metal silicide layers 17 are formed, such as nickel silicide layers as by depositing a layer of nickel and then conducting rapid thermal annealing during which silicon in the gate electrodes 12 and substrate 10 react with the deposited nickel to form nickel silicide layers 17. Nickel silicide layers 17 are formed at a targeted thickness such that spiking and separation does not occur, as at a thickness of about 50 Å to 100 Å.

Figure 2:
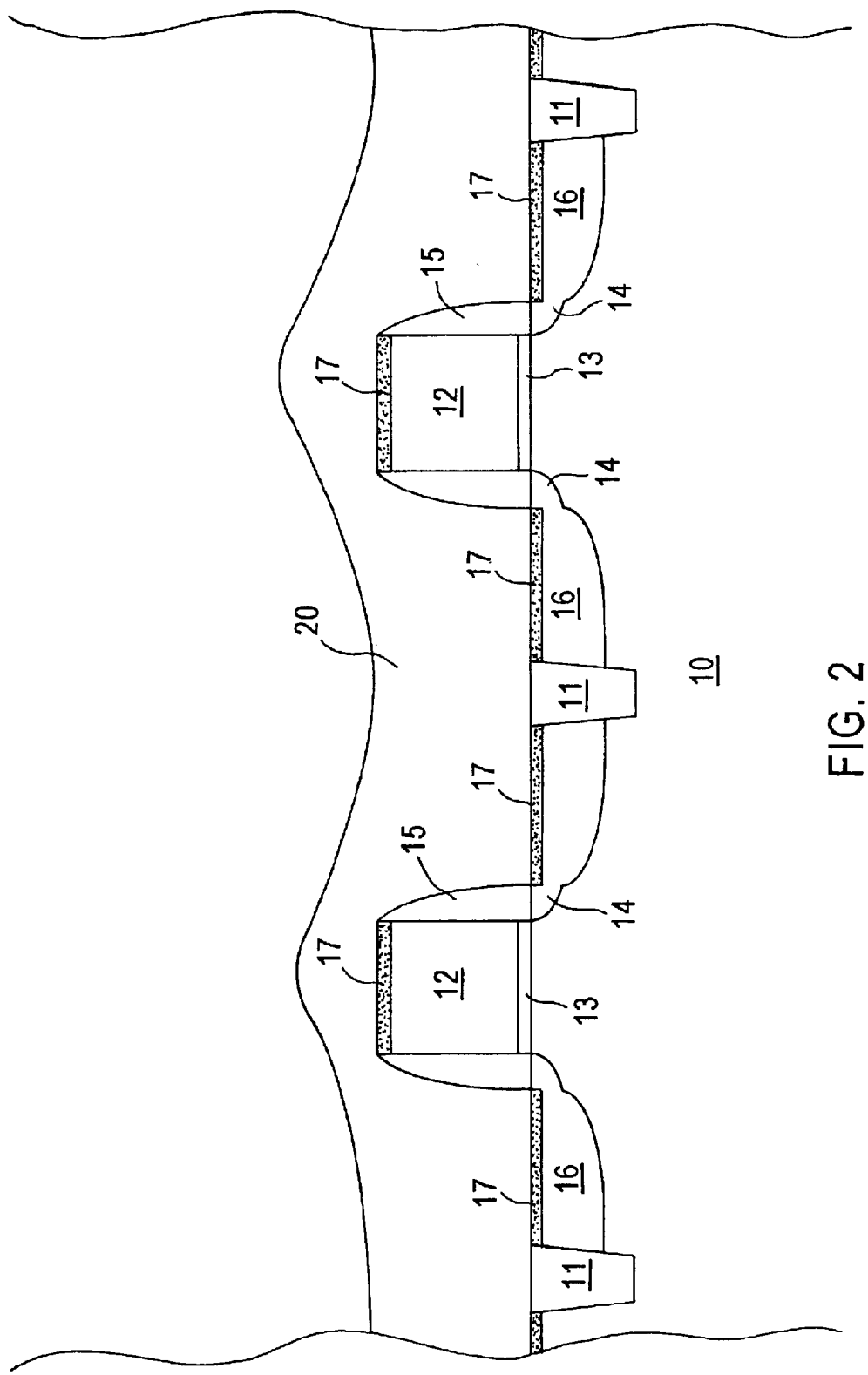
Figure 3:
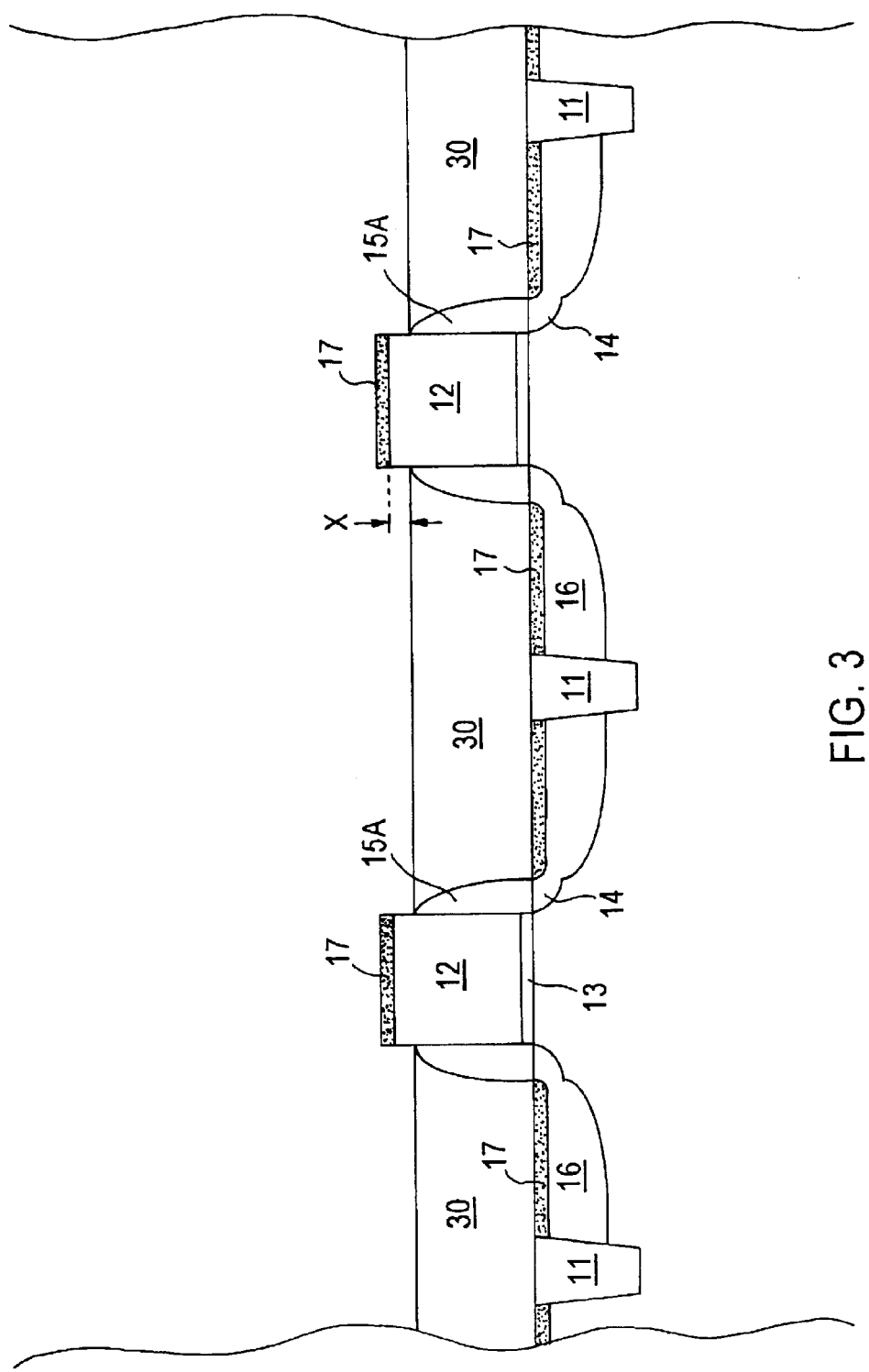

Subsequently, a dielectric layer 20 is deposited, such as a HDP oxide layer, filling the gaps between gate electrodes 12 and extending above the metal silicide layers 17 formed on the gate electrodes 12, as illustrated in FIG. 2. Dielectric layer 20 is then etched back, as shown in FIG. 3 forming a dielectric layer 30 of reduced thickness and exposing the metal silicide layers 17 formed on the gate electrodes 12. Embodiments of the present invention include etching back dielectric layer 20 to expose a portion of the side surfaces of gate electrodes 12, as at a distance X below the metal silicide layers 17 on the gate electrodes 12, wherein X is typically about 100 Å to 1,000 about Å. In forming silicon nitride sidewall spacers 15, a portion of the upper surface of the sidewall spacers 15 can be removed, as by employing hot phosphoric acid, to expose the side surfaces of the gate electrodes 12, forming sidewall spacers 15A of reduced height.

Figure 4:
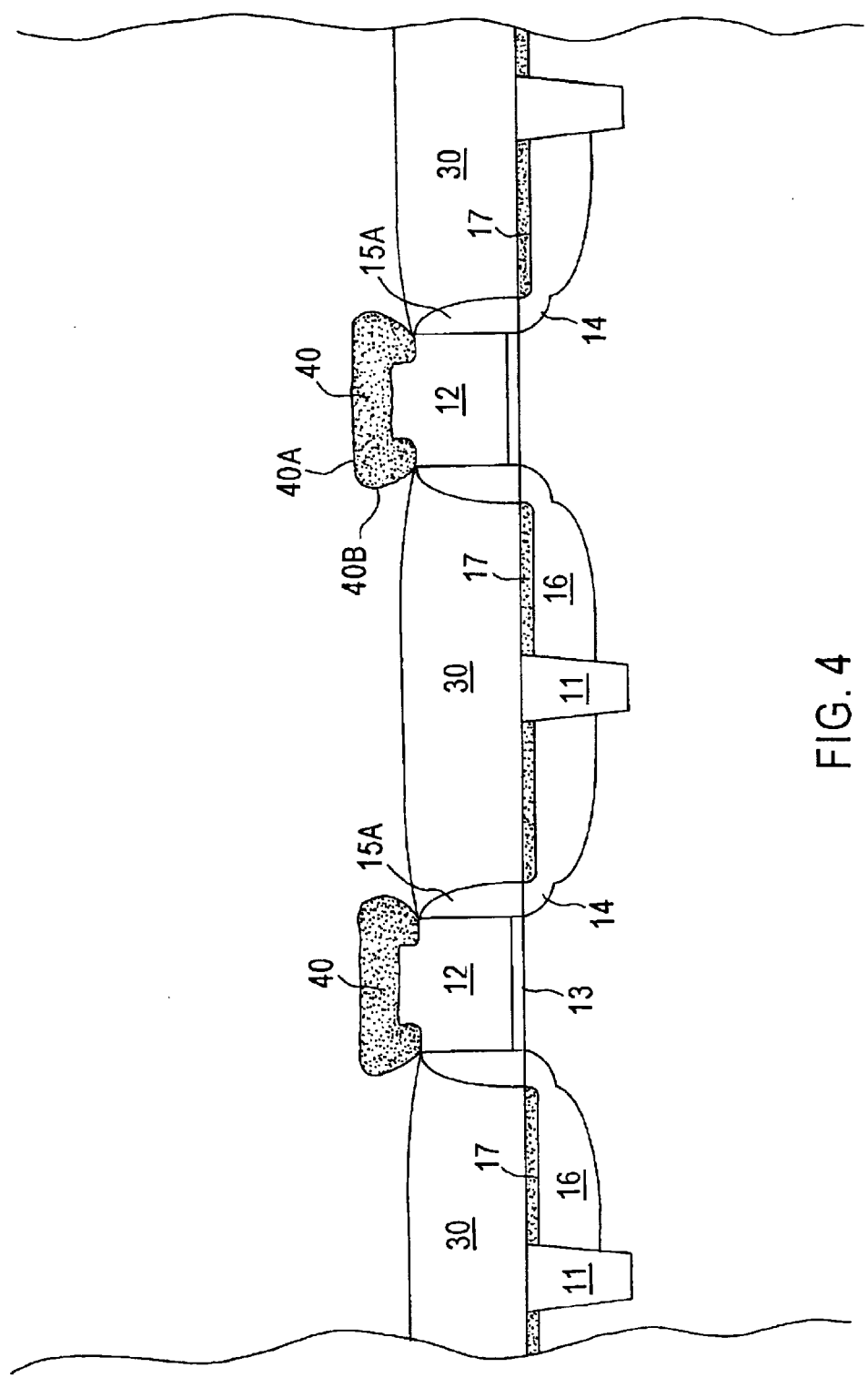

Subsequently, as shown in FIG. 4, gate electrodes 12 are resilicidized, as by depositing another layer of metal, such as nickel, and then rapid thermal annealing. During such rapid thermal annealing, silicon in gate electrodes 12 diffuses through metal silicide layer 17 thereon to react to with deposited metal thereby forming rapid thermal metal silicide layers 40 having an upper surface 40A typically having a thickness of about 100 Å to 200 about Å, and having metal silicide layers 40A on side surfaces of the gate electrodes, typically having a thickness of 50 Å to 100 Å. The resulting metal silicide layers 40 have a mushroom shape is shown in FIG. 4.

Figure 5:
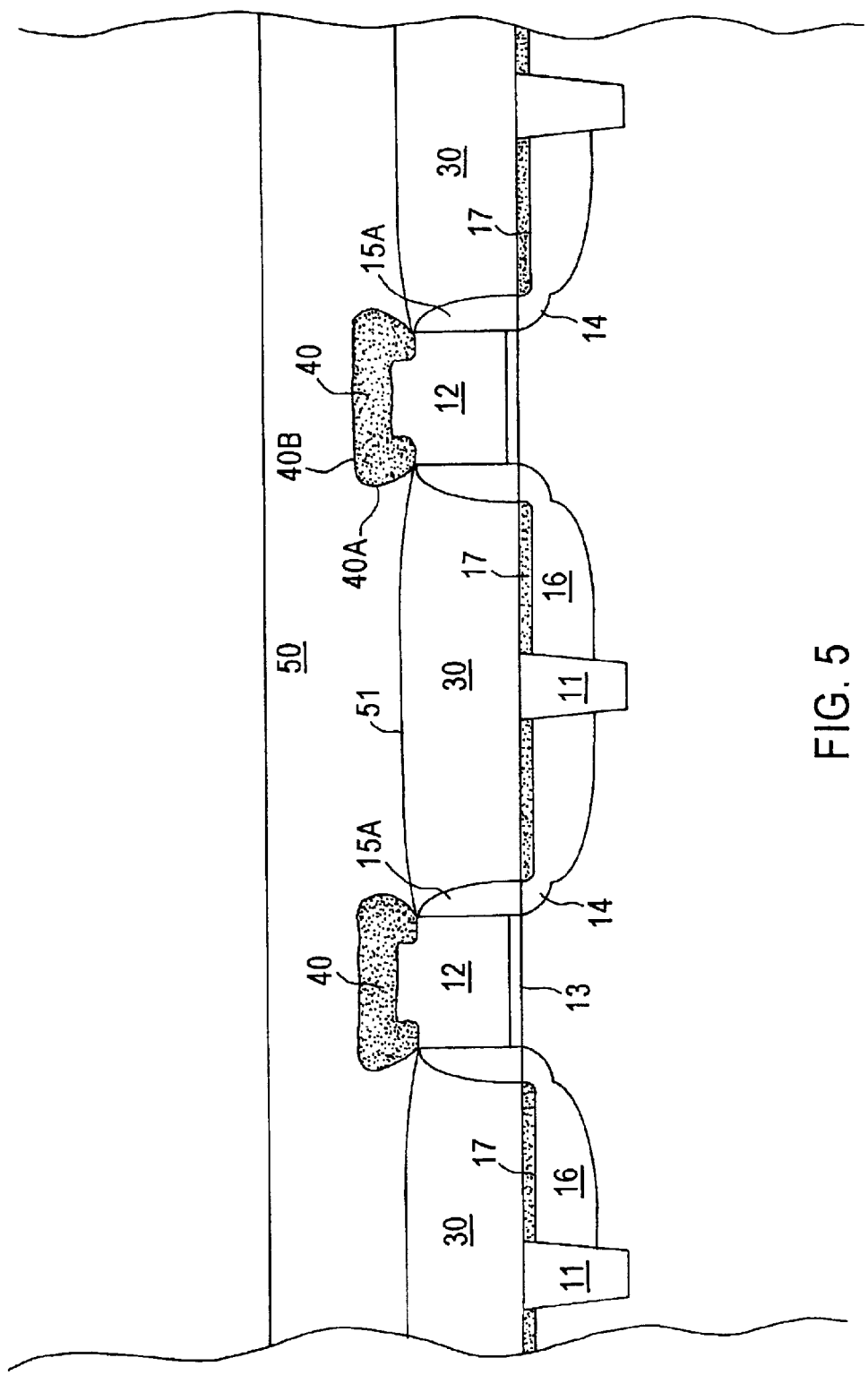

Subsequently, as illustrated in FIG. 5, a second dielectric layer 50 is deposited and planarized. Dielectric layer 50 need not be deposited in the same manner as originally deposited dielectric layer 20 and need not be of the same material. For example, dielectric layer 50 can be deposited by chemical vapor deposition using tetraethyl orthosilicate (TEOS), or by plasma enhanced chemical vapor deposition of silicon nitride or silicon oxynitride. On depositing second dielectric layer 50, an interface 51 is formed between dielectric layer 50 and dielectric layer 30 due to a grain boundary and/or mismatch. The resulting structure is illustrated in FIG. 5.

The present invention provides methodology enabling the fabrication of semiconductor devices having features in the deep sub-micron regime, as with a design rule of less than 0.12 micron, with relatively thick metal silicide layers on the gate electrodes optimized for reduced resistance and increased operating speed, while at the same time having relatively thin metal silicide layers on the source/drain regions optimized to avoid silicon spiking and separation.

The present invention enjoys industrial applicability in fabricating various types of semiconductor devices. The present invention is particularly applicable in fabricating reliable semiconductor devices with high circuit speeds having design features in the deep sub-micron regime and high integrity ultra shallow junctions.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method of manufacturing a semiconductor device, the method comprising:

forming a plurality of polysilicon gate electrodes, each having an upper surface and side surfaces, over an upper surface of a silicon substrate with a gate dielectric layer therebetween, the gate electrodes being spaced apart by a gap therebetween;

forming source/drain regions in the upper surface of the substrate on opposite sides of each gate electrode with a channel region therebetween;

forming a metal silicide layer, having a first thickness, on the upper surface of the gate electrodes and on the source/drain regions;

depositing a first dielectric layer over the substrate filling the gaps and extending above the metal silicide layers on the gate electrodes;

etching back the first dielectric layer to selectively expose the metal silicide layers on the upper surface of the gate electrodes and to expose side surfaces of the gate electrodes under the first metal silicide layers, but not the metal silicide layers on the source/drain regions; and increasing the first thickness of the metal silicide layers on the gate electrodes to form second metal silicide layers on the gate electrodes having a second thickness greater than the first thickness by resilicidizing the gate electrodes, thereby forming metal silicide on the exposed side surfaces of the gate electrodes such that the second metal silicide layers are mushroom shaped.

2. The method according to claim 1, comprising:

depositing a second dielectric layer on the first dielectric layer forming an interface therebetween; and planarizing the second dielectric layer.

3. The method according to claim 2, comprising depositing an oxide by high density plasma oxide deposition as the first dielectric layer.

4. The method according to claim 1, comprising resilicidizing the gate electrodes by:

depositing a layer of metal; and heating to react the deposited metal with silicon in the gate electrodes.

5. The method according to claim 1, wherein:

the first thickness is 50 Å to 100 Å; and the second thickness is 100 Å to 200 Å.

6. The method according to claim 1, comprising resilicidizing to form metal silicide layers on the side surfaces of the gate electrodes having a thickness of 50 Å to 100 Å.

* * * * *